(12) United States Patent
Sperber

(10) Patent No.: US 10,820,408 B2
(45) Date of Patent: Oct. 27, 2020

(54) MULTI-LAYER CIRCUIT BOARD AND ELECTRONIC ASSEMBLY HAVING SAME

(71) Applicant: ZF Friedrichshafen AG, Friedrichshafen (DE)

(72) Inventor: Michael Sperber, Bayreuth (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 16/485,340

(22) PCT Filed: Feb. 6, 2018

(86) PCT No.: PCT/EP2018/052859
§ 371 (c)(1),
(2) Date: Aug. 12, 2019

(87) PCT Pub. No.: WO2018/149687
PCT Pub. Date: Aug. 23, 2018

(65) Prior Publication Data
US 2020/0008293 A1    Jan. 2, 2020

(30) Foreign Application Priority Data

Feb. 14, 2017   (DE) ........................ 10 2017 202 329

(51) Int. Cl.
*H05K 1/02*   (2006.01)
*H05K 1/11*   (2006.01)
*H05K 5/00*   (2006.01)

(52) U.S. Cl.
CPC ......... *H05K 1/0207* (2013.01); *H05K 1/0206* (2013.01); *H05K 1/115* (2013.01); *H05K 5/0082* (2013.01); *H05K 2201/09236* (2013.01)

(58) Field of Classification Search
CPC .... H05K 1/0207; H05K 1/0206; H05K 1/115; H05K 2201/09236
See application file for complete search history.

(56) References Cited

U.S. PATENT DOCUMENTS 5,285,018 A * 2/1994 Pence, IV ............... H01L 23/50
                                                    174/255
5,912,597 A   6/1999 Inagawa et al.
(Continued)

FOREIGN PATENT DOCUMENTS

DE   102017202329.5   2/2017
WO   WO 2018/149687 A1   8/2018

OTHER PUBLICATIONS

International Search Report from European Patent Office ISA in PCT/EP2018/052859 dated May 9, 2018 (2 pgs in English, 2 pgs.in German).

*Primary Examiner* — Steven T Sawyer
(74) *Attorney, Agent, or Firm* — Brinks Gilson & Lione

(57) ABSTRACT

A multi-layer circuit board comprising a carrier plate with an upper surface and a lower surface, and at least one electrically conductive upper inner layer located on the upper surface of the carrier plate and an electrically insulating upper intermediate layer located thereon, and an electrically conductive upper outer layer located thereon, forming the outermost layer of the upper surface. At least one electrically conductive lower inner layer is located on the lower surface of the carrier plate and an electrically insulating lower intermediate layer located thereon, and an electrically conductive lower outer layer located thereon, forming the outermost layer of the lower surface. The upper and/or lower outer layers are populated with components, and conductor paths in one of the inner layers are oriented in different (Continued)

directions from conductor paths in the other inner layer, and the region between the conductor paths is flooded with a voltage.

9 Claims, 3 Drawing Sheets

(56) References Cited

U.S. PATENT DOCUMENTS

| | | | |
|---|---|---|---|
| 5,982,630 A * | 11/1999 | Bhatia | H05K 1/0207 |
| | | | 216/20 |
| 2002/0105083 A1* | 8/2002 | Sun | H01L 21/486 |
| | | | 257/758 |
| 2006/0126310 A1* | 6/2006 | Watanabe | G06F 1/203 |
| | | | 361/720 |
| 2010/0175911 A1 | 7/2010 | Morrison | |
| 2013/0148314 A1* | 6/2013 | Hirai | H05K 7/06 |
| | | | 361/748 |
| 2014/0061692 A1* | 3/2014 | Preuschl | H05K 1/0206 |
| | | | 257/91 |
| 2014/0133114 A1 | 5/2014 | Saji et al. | |
| 2018/0288866 A1* | 10/2018 | Silvano De Sousa | |
| | | | H05K 1/0274 |

* cited by examiner

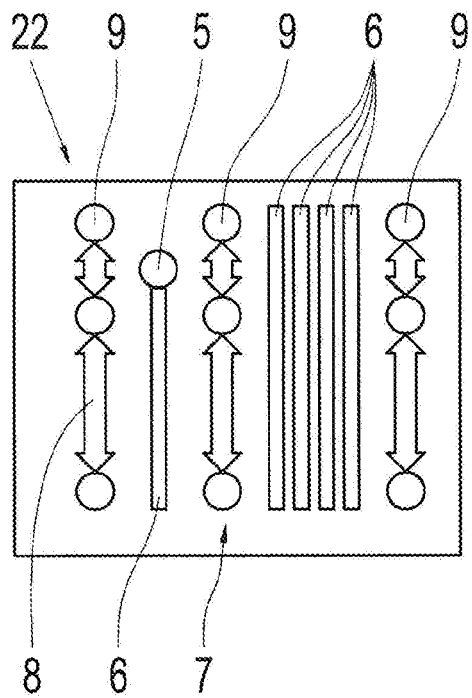
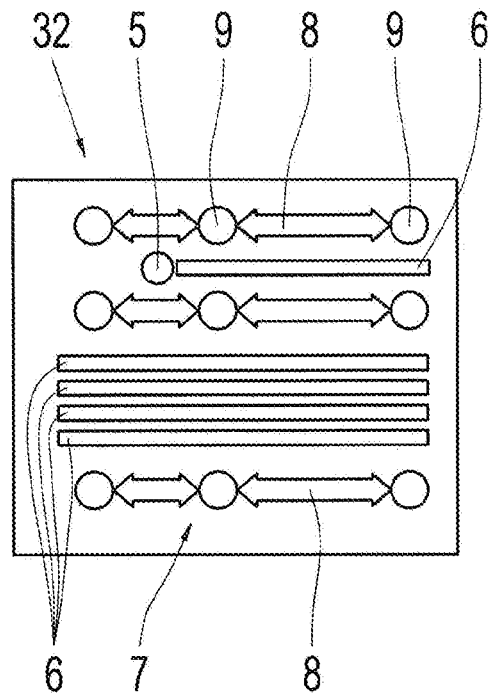
Fig. 2a
Fig. 2b
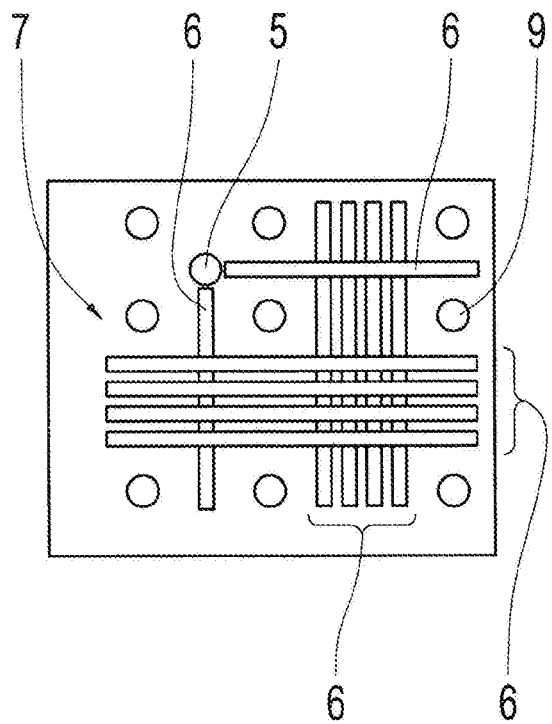
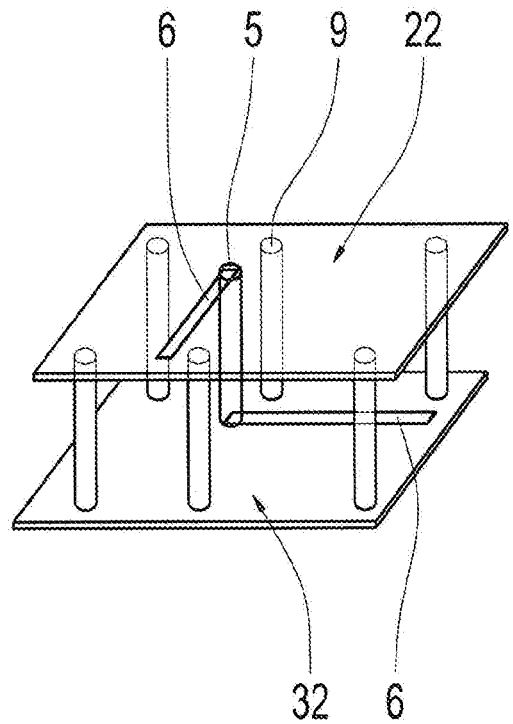
Fig. 2c
Fig. 2d

MULTI-LAYER CIRCUIT BOARD AND ELECTRONIC ASSEMBLY HAVING SAME

RELATED APPLICATIONS

This application is a filing under 35 U.S.C. § 371 of International Patent Application PCT/EP2018/052859, filed Feb. 6, 2018, claiming priority to German Patent Application 10 2017 202 329.5, filed Feb. 14, 2017. All applications listed in this paragraph are hereby incorporated by reference in their entireties.

TECHNICAL FIELD

The present disclosure relates to a multi-layer circuit board and a corresponding assembly.

BACKGROUND

Multi-layer circuit boards with numerous electrically conductive layers are used conventionally for highly integrated circuits. An electronic device with a circuit board serving as a control unit and populated with components is used in transmission controls. Modules can also be provided on the circuit board, e.g., connectors to the vehicle for power supply, communication, etc., as well as connectors to the transmission, including sensors, and contacts to outlets.

Because of increasing demands on the transmission control, increasing numbers of components, some of which are extremely temperature sensitive, are placed on the circuit board. As a result, the populating of the circuit board is increasingly denser or more compact, and possibilities must be created for cooling the components placed on the circuit board.

An electronic component or device that has a circuit board and a method for producing such is proposed in DE 10 2015 210 099 A1 for solving the problem of cooling components on a circuit board. This device is configured such that the electronic components mounted on the circuit board are cooled with a metallic housing that forms a heat sink. Additional thermally conductive materials are necessary for a sufficient cooling connection.

A circuit board is proposed in DE 2011 088 256 A1 that requires thermally conductive metalized cooling end surfaces for the operation thereof.

A circuit board for an electronic transmission control is proposed in DE 10 2011 076 817 A1 that requires reinforced micro-contacts for the operation thereof.

The prior art has the disadvantage that additional components such as thermally cooling or thermally conductive materials are necessary for the operation thereof, requiring additional processing steps during the production process, and which may also require complicated assembly processes, thus increasing the costs for such circuit boards.

SUMMARY

An object of the present disclosure is therefore to produce a multi-layer circuit board and an electronic assembly that contains a multi-layer circuit board, by means of which the aforementioned disadvantages are resolved.

This object is achieved by the features of the independent claims. Advantageous embodiments are the subject matter of the dependent claims.

A multi-layer circuit board is produced that comprises a carrier plate with an upper surface and a lower surface and at least one electrically conductive upper inner layer on the upper surface of the carrier plate and an electrically insulating upper intermediate layer placed thereon, and an electrically conductive upper outer layer placed on the outermost insulating upper intermediate layer that forms the outermost layer of the upper surface of the carrier plate, and at least one electrically conductive lower inner layer placed on the lower surface of the carrier plate, and an electrically insulating lower intermediate layer placed thereon, and an electrically conductive lower outer layer placed on the outermost insulating lower intermediate layer, which forms the outermost layer of the lower surface of the carrier plate, and wherein the upper and/or lower outer layers are populated with components, and wherein conductor paths in one of the inner layers that are connected to conductor paths in other inner layers run in a different direction, and the region between the conductor paths is flooded with a voltage.

The number of necessary copper layers can be reduced by the routing concept explained above, because a dedicated ground layer is not necessary. The specialized assembly in which each inner layer contains conductor paths running in only one direction, the preferential direction, has the advantage that thermally conductive channels are formed parallel to the conductor paths, thus resulting in an effective cooling.

In one embodiment, conductor paths in an inner layer are substantially parallel to one another, and the connecting conductor paths in an adjacent inner layer are substantially orthogonal thereto.

In one embodiment, thermally conductive channels formed in the voltage and parallel to each of the conductor paths each have at least one thermally conductive through connection.

As a result of the thermally conductive channels that are preferably orthogonal to one another and interconnected via through connections, a dense network of thermally conductive channels is obtained in the inner layers, which enables a very uniform heat distribution. Furthermore, the advantages with regard to self destruction and irradiation obtained with the configurations of the conductor paths and the resulting thermally conductive channels are substantial, because the thermally conductive channels function in the same manner as symmetrical return conductors for signals in adjacent routing channels via the dense network of vertical through connections, resulting in a very low impedance grounding structure.

In one embodiment, numerous conductor paths are combined to form conductor path groups, and formed in the voltage, and thermally conductive channels parallel to each of the conductor path groups are each provided with at least one thermally conductive through connection.

By combining numerous conductor paths to form signal groups, preferably with applied electrical properties, thus, e.g., in a group of analog conductors, an effective bundling is obtained, and foreign signals, e.g., digital conductors in this example, can be effectively shielded via the voltage structure between them, e.g., in the form of a grounding structure.

In one embodiment there are numerous thermally conductive through connections at a defined spacing to one another. In this manner, a dense network of thermally conductive channels can be generated, thus resulting in an effective cooling within the multi-layer circuit board.

In one embodiment, the upper and/or lower outer layers have conductor paths. As a result, the available space can likewise be used for connecting the components, in particular components with high power consumption.

In one embodiment, a power supply signal is conducted via at least one conductor path in the form of a first conductor track on an outer layer between at least two components located on this outer layer that are to be connected to one another, and a return signal is conducted over a conductor path in the form of a second conductor track to the first inner layer directly adjacent to the outer layer.

In one embodiment, the first conductor track is subdivided onto the upper and lower outer layers, and the parts of the first conductor track are connected via electrically conductive through connections or through contacts between the upper and lower outer layers.

By using the outer layers for conducting signals or current, an advantage is obtained that through connections are not needed for conducting current. A current path with a nearly constant cross section can be obtained via the power supply path and the current return path, which is not reduced in size by the holes for the electrically conductive through connections. Furthermore, the thermal impedances and associated losses in the alignment or routing of the power supply and current return path are avoided. Furthermore, the electrically conductive through connections required for the return path can be used for connecting regions outside the power supply paths, or adjacent to the power supply path.

In one embodiment, the upper intermediate layer that is directly adjacent to the upper outer layer can have a thickness of less than 100 μm, and/or the lower intermediate layer directly adjacent to the lower outer layer can have a thickness of less than 100 μm.

By distributing conductor tracks on the outer layer, an enlarged overlapping surface area is obtained between the power supply and the current return path. This results in the advantage that the outer layer and first inner layer can be closer together. Furthermore, this reduction in the spacing between the layers results in an improved anti-parallel orientation of the power supply and the current return path. This ensures an improved current symmetry and an improved, frequency independent, magnetic field elimination or reduction.

An electronic assembly with a housing and a multi-layer circuit board described above located therein is also proposed.

The self-cooling multi-layer circuit board described above can be used if it is not possible to effectively connect an electronic assembly to a heat sink in a structure, in order to cool the electronic components on both sides of the circuit board, because there are no additional external cooling elements or it is not possible to connect them to metallic heat sinks, e.g., a transmission bell housing. As a result, the number of processing steps and additional error-prone components, as well as costs, can be reduced.

Further features and advantages of the present disclosure can be derived from the following description of exemplary embodiments based on the figures showing drawings of the details of the present disclosure, and the claims. The individual features can be implemented in and of themselves, or in numerous arbitrary combinations, forming variations of the present disclosure.

BRIEF DESCRIPTION OF THE DRAWINGS

Preferred embodiments of the present disclosure shall be explained in greater detail below based on the attached drawings.

FIGS. 2a and 2b show top views of the first upper and first lower inner layers of a multi-layer circuit board according to an embodiment of the present disclosure;

FIG. 2c shows a top view of stacked first upper and first lower inner layers of the multi-layer circuit board shown in FIGS. 2a and 2b, according to an embodiment of the present disclosure;

FIG. 2d shows a perspective view of the stacked inner layers shown in FIG. 2c;

DETAILED DESCRIPTION

In the following description of the drawings, identical elements and functions are given the same reference symbols.

A multi-layer circuit board with at least four electrically conductive layers is provided for the purpose described above, wherein two of them form outer layers, i.e., the outermost layers, which can be populated with components. Furthermore, at least two of the other layers form electrically conductive inner layers. Further inner layers are conceivable, although the following descriptions refer to two inner layers, because the principles used herein can be applied to further inner layers.

Figure 1:
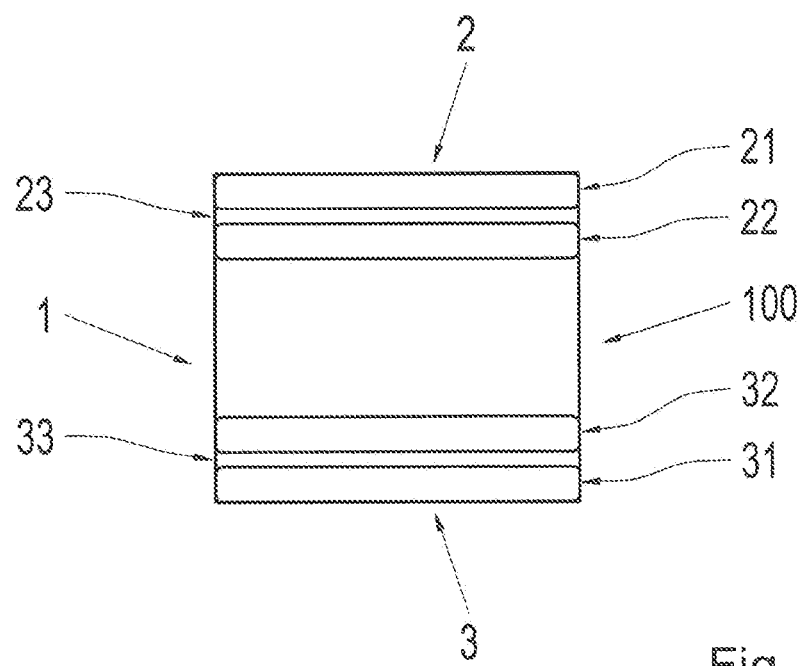
FIG. 1 shows a sectional view of a multi-layer circuit board according to an embodiment of the present disclosure.

FIG. 1 shows a sectional view of a multi-layer circuit board 100 according to an embodiment of the present disclosure. The multi-layer circuit board 100 has four electrically conductive layers or laminates 21, 22, 31, 32. These are preferably made of an electrically conductive material, e.g., copper.

It can be seen in FIG. 1 that two outermost layers are formed on the outermost upper surface 2 and the outermost lower surface of the multi-layer circuit board 100. These are referred to in the following as the upper outer layer 21 and lower outer layer 31 depending on their locations. The structure of the multi-layer circuit board 100 comprises an alternating arrangement of electrically conductive layers 21, 22, 31, 32 and electrically insulating layers 23, 33 on the carrier layer 1. The carrier layer 1 is preferably an electrically insulating layer, such that an electrically conductive layer, e.g., the first upper inner layer 22 and/or the first lower inner layer 32 can be applied thereto to form the first layer.

There is at least one more layer between an outer layer 21 or 31 and the carrier layer 1, referred to in the following as the upper inner layer 22 or lower inner layer 32, depending on their locations. Each of the inner layers 22 and 32 is separated from each adjacent layer by an electrically insulating intermediate layer. There is only one intermediate layer 22 or 32 in FIG. 1, because there are only one upper and one lower inner layer 22, 32 and one upper and one lower outer layer 21, 31.

The layers 21-23 and 31-33 are each successively applied to the carrier by means of known methods.

A substantial feature of the construction of the proposed multi-layer circuit board 100 is that the directions of the conductor paths 6 in the individual inner layers 22 and 32 (exclusively) are in a respective preferred direction. The respective preferred directions of the conductor paths 6 in the different inner layers 22 and 32 of the multi-layer circuit board 100 are shown in FIGS. 2a and 2b. FIG. 2a shows the first upper inner layer in a top view. The conductor paths 6 arranged in part in groups are aligned or routed in just one direction, the vertical direction in FIG. 2a. The first lower inner layer 32 is shown in a top view in FIG. 2b. Here, the conductor paths and conductor path groups 6 are aligned or routed in a different direction to that of the conductor paths 6 in the first upper layer 22, preferably orthogonal thereto, shown as the horizontal direction in FIG. 2b. FIG. 2c shows a top view of the two inner layers 22 and 32 shown in FIGS. 2a and 2b, in which the conductor paths and conductor path groups 6 of the lower inner layer 32 that are not actually visible can also be seen. It can also be seen that the thermal through connections 9 and the electrically conductive through connections 5 for connecting the conductor paths 6 lie directly opposite one another when the inner layers are located directly above one another, or the multi-layer circuit board 100 is assembled. The carrier layer 1 and the insulating intermediate layers 23 and 33 are not shown therein for purposes of clarity. This can likewise be seen in FIG. 2d, which shows a perspective view of the embodiment shown in FIG. 2c, without the carrier plate 1 and without the insulating intermediate layers 23 and 33.

Furthermore, all of the regions of the multi-layer circuit board 100 that are not used for the conductor paths 6 are flooded with a voltage, e.g., a ground. This takes place in turn via known methods. The alignment of the conductor paths 6 in a preferred direction for each of the inner layers 22 and 32, and the flooding with a voltage 7, has the advantage that thermally conductive channels are formed parallel to the direction of the conductor paths 6, which are shown as arrows in the drawings. As a result, each conductor path 6 can have a dedicated thermally conductive channel 8. Conductor path groups 6 with m*n conductor paths 6 can also be densely arranged or routed. These groups 6 that bundle, e.g., analog conductors or digital conductors, can each have a single dedicated collective thermally conductive channel 8. As a result, there are thermally conductive channels 8 in the upper and lower inner layers 22 that are orthogonal to one another, when the conductor paths 6 or conductor path groups 6 are orthogonal to one another, as shown in FIGS. 2a and 2b.

Furthermore, densely arranged vertical thermal through connections 9 are formed in the thermally conductive channels 8 that thermally connect the individual electrically conductive layers to one another, in this case the inner layers 22 and 32. As a result, a dense network of thermally conductive channels 8 is formed in the inner layers 22 and 32, such that the heat generated by the current and/or the components can be evenly distributed in all of the regions of the multi-layer circuit board 100.

It can also be seen that individual connections are extended, because diagonal routing is not used for the direct connection, such that all of the advantages listed above are clearly obtained.

In a further development, the outer layers 21 and 31 are also used for conductor paths, as long as there is enough space between the components 4 and 41-43 placed on the multi-layer circuit board 100. It should also be noted that adjacent layers 21, 22 and 31, 32, are each oriented at a right angle to one another.

Moreover, the advantages obtained from the routing concept described above, likewise regarding self-destruction and irradiation properties, are also substantial, because the thermally conductive channels 8 act in the same manner as symmetrical return paths for signals in the adjacent routing channel via densely arranged vertical through connections, resulting in a very low impedance grounding structure.

Furthermore, signal groups or conductor path groups 6 that have applicable electrical properties, e.g., analog conductors, can be effectively bundled, and foreign signals, e.g., digital signals, can be effectively shielded via the grounding structure.

Furthermore, the multi-layer circuit board 100 is simplified in that no metalized end surfaces and micro-connections are needed. In addition, the number of necessary copper layers, in particular the inner layers 22 and 32, can be reduced by the routing concept described herein, because dedicated ground layers are not necessary, due to the flooding of the regions of the multi-layer circuit board 100 that are not used for the conductor paths 6 with a voltage.

In another embodiment, a simplified power routing concept is shown that is used for signals with a higher power consumption.

Figure 3:
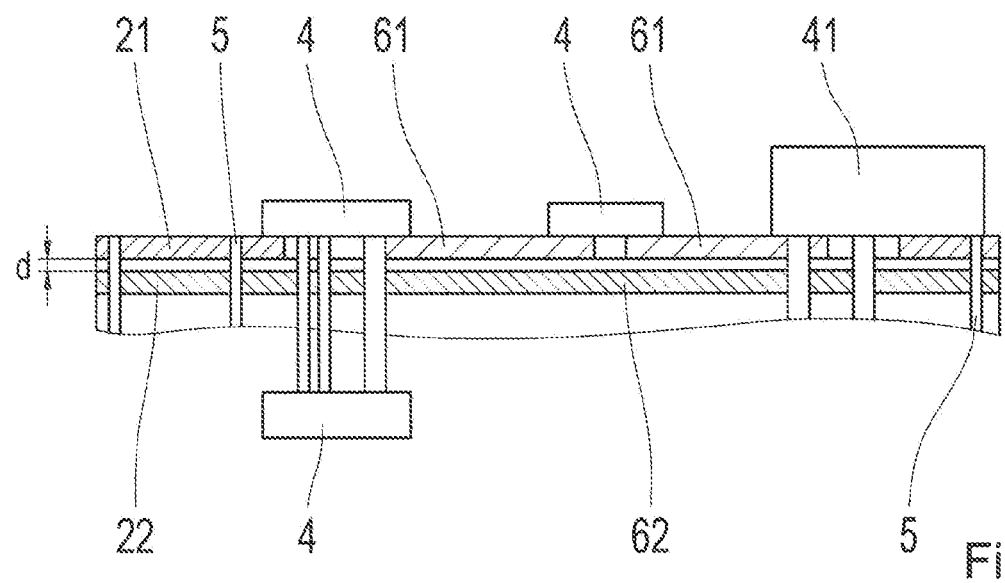
FIG. 3 shows a sectional view of a conductor path layout according to an embodiment of the present disclosure.
Figure 4:
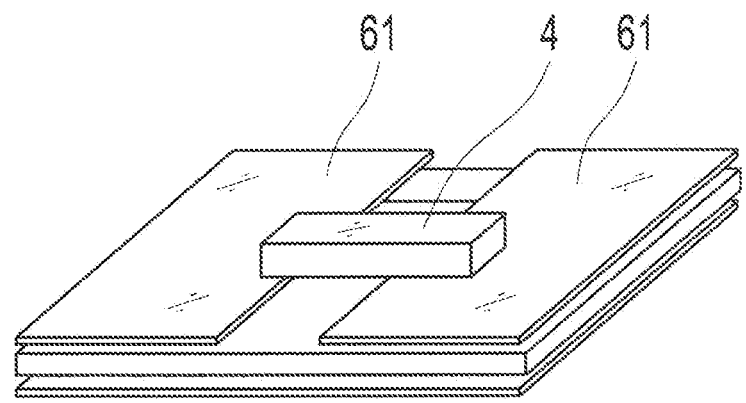
FIG. 4 shows a perspective view of the embodiment shown in FIG. 3.

An embodiment of the power supply conductors configured for increased power consumption is shown in FIG. 3. By way of example, a power supply line, referred to as a power supply conductor, or first conductor track 61, leads to the outer layer 21 of a vehicle connector 41 connected to a power supply via an electronic switch 4 at terminals 4, the outputs of which lead to a valve connector 4, which in turn is connected to valves functioning as actuators. It returns via a second conductor track 62, which is preferably located in the first inner layer 22, thus the layer directly adjacent to the outer layer 21. FIG. 4 shows a perspective view of FIG. 3, in which it can be readily seen that the power supply conductor, thus the first conductor track 61, has a continuous surface area, i.e., is not interrupted by through connections.

The simplified power routing concept has various advantages obtained by the routing of the power supply signal on one of the outer layers 21 or 31. No electrically conductive through connections are needed for implementing the power supply, resulting in a power path via the power supply path, thus the first conductor track 61, with a nearly constant cross section, which is not reduced in size by the holes for the electrically conductive through connections. Furthermore, thermal impedances and associated losses are avoided in the routing of the power supply.

By routing the current return signal, thus the second conductor track 62 to the first inner layer 22 adjacent to the outer layer 21 directly beneath the current supply signal, thus the first conductor track 61, a current path with a nearly constant cross section can likewise be provided via the current return path, that is not reduced in size by the holes for through connections. Furthermore, thermal impedances and associated losses are also avoided in the routing of the current return path. The electrically conductive through connections 5 necessary for connecting the current return path can be located in regions outside the power supply path 61, or adjacent to the power supply path 61, as shown in FIG. 3.

Furthermore, the necessary conductor cross section for the power supply conductor signal can be supplied by widened conductor tracks 61 on the outer layer 21, instead of using numerous layers in parallel. The same applies for providing the necessary conductor cross section for the current return path signals through widened conductor tracks 62 on the inner layer 22 adjacent to the outer layer 21. It is not necessary to use numerous layers in parallel for this either.

This arrangement has the advantage that an enlarged overlapping surface area is obtained between the power supply and the current return paths. The width of the conductor tracks 61 and 62 depends on the necessary power consumption, and is determined by the person skilled in the art, depending on the application.

In addition, a thin insulating medium, also referred to as the first intermediate layer 23 or 33, can be used between the outer layers 21 and 31 and the adjacent inner layers 22 and 33, respectively, e.g., exhibiting a thickness of d<100 μm. This results in the advantage that there can be a smaller spacing between the outer layers 21 and 31 and the first inner layers 22 and 33, respectively. In combination with the enlarged overlapping surface area, the thermal transition resistance of the outer layers 21 and 31 serving as a heat source for the first inner layers 22 and 33, which functions as a heat sink in combination with other electrically conductive surfaces in the multi-layer circuit board, can be reduced to a minimum. Furthermore, reducing the spacing d results in an improved anti-parallel alignment of the power supply and the current return paths. This results in an improved current symmetry, and an improved, frequency independent, magnetic field elimination or magnetic field reduction.

Figure 5:
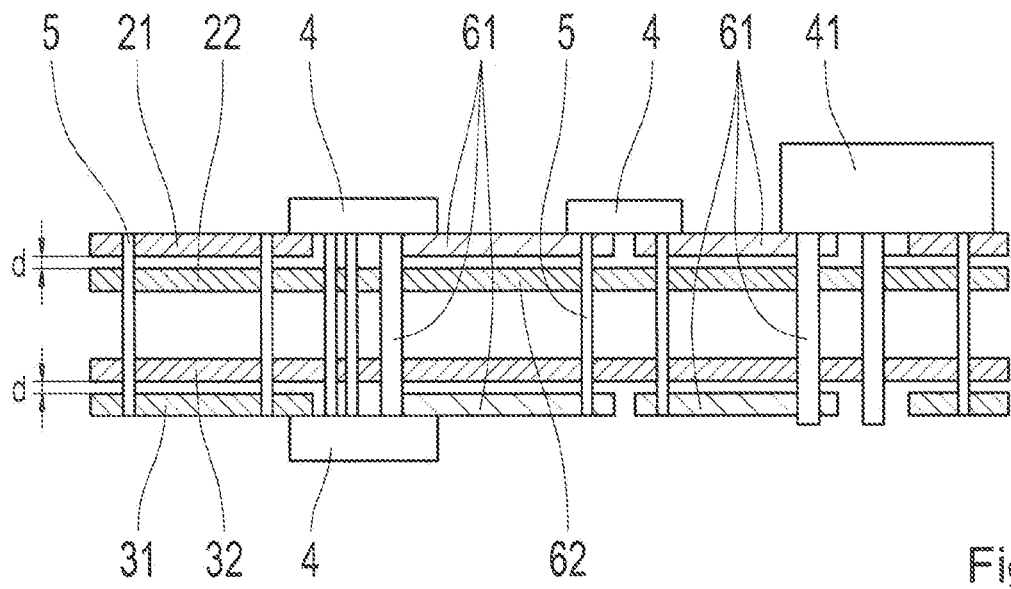
FIG. 5 shows a sectional view of a conductor path layout according to an alternative embodiment of the present disclosure.

A further development of the assembly shown in FIG. 3 is shown in FIG. 5. This may be necessary if the available conductor path width on an outer layer 21 or 31 is not sufficient for the necessary supply current. For this reason, the current can be divided equally onto both outer layers 21 and 31. The supply current is thus not conducted on just one of the two outer layers 21, 31. The arrangement explained in reference to FIGS. 3 and 4 is thus mirrored on the opposed side of the circuit board, e.g., from the upper surface 2 to the lower surface 3. In order to produce the corresponding conductive connection, electrically conductive through connections 5, e.g., insertion contacts or plugs, are used. The inputs and outputs thereof are opposite one another, such that a direct connection is produced by the multi-layer circuit board 100, as can be seen in FIGS. 2*d*, 3 and 5. As a result, not only is the cross section of the power supply doubled, but also the transition surface area. Furthermore, the thermal resistance is halved, and the current symmetry is not impaired.

Figure 6:
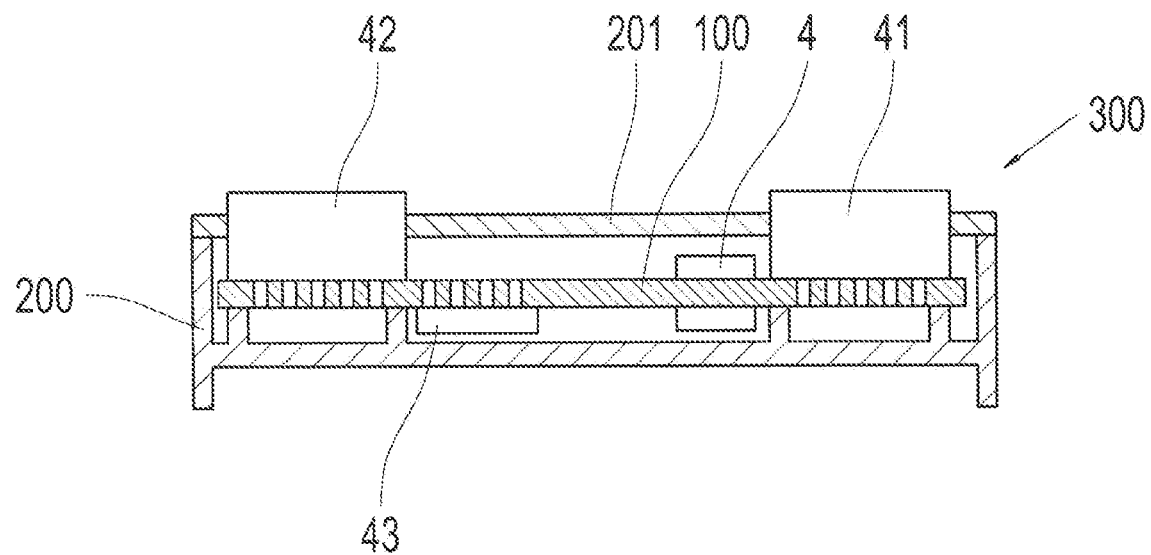
FIG. 6 shows a schematic construction of an electronic assembly comprising the multi-layer circuit board according to an embodiment of the present disclosure.

An electronic assembly is shown in FIG. 6, in which the multi-layer circuit board 100 described herein can be placed. For this, the multi-layer circuit board 100 is mounted, e.g., on a plastic housing 200. Furthermore, the multi-layer circuit board 100 is connected in the transmission with connectors 41 to the vehicle, comprising the power supply, communication, etc., to the transmission, which comprises sensors, etc. and a connection to valves, thus a valve connector 43. The housing is closed with a lid 201, such that the transmission connector(s) 42 and the vehicle connector(s) 41 protrude, providing a connection possibility to the interior of the housing 200, in particular to the multi-layer circuit board 100. Such a construction can be obtained inexpensively. The multi-layer circuit board 100 itself is operated at an ambient temperature of ca. 105°-120° C. In this construction, it is not possible to connect it effectively to a heat sink for cooling the electronic components populating both sides of the circuit board, because it is not possible to connect it to additional external cooling elements, or metallic heat sinks, e.g., a transmission bell housing. The solutions from the prior art can therefore not be used, and the circuit board itself must be constructed such that it is capable of cooling itself, thus ensuring that the electronic components on both sides of the circuit board function reliably. This is ensured by the multi-layer circuit board described above.

REFERENCE SYMBOLS

100 multi-layer circuit board
1 carrier plate
2 upper surface of the carrier plate
21 upper outer layer
22 first upper inner layer
23 first upper intermediate layer
d thickness of the intermediate layers 23 and 33
3 lower surface of the carrier plate
31 lower outer layer
32 first lower inner layer
33 first lower intermediate layer
4 electronic components
41 vehicle connector
42 transmission connector
43 valve connector
5 electrically conductive through connections
6 conductor paths
61 first conductor track
62 second conductor track
7 ground
8 thermally conductive channel
9 thermal through connections
300 electronic assembly
200 housing
201 lid

The invention claimed is:

1. A multi-layer circuit board comprising:
a carrier plate with an upper surface and a lower surface;
at least one electrically conductive upper inner layer on the upper surface of the carrier plate;
an electrically insulating upper intermediate layer on the at least one electrically conductive upper inner layer;
an electrically conductive upper outer layer on the insulating upper intermediate layer and forming an outermost layer of the upper surface of the carrier plate;
at least one electrically conductive lower inner layer located on the lower surface of the carrier plate;
an electrically insulating lower intermediate layer on the lower surface of the carrier plate; and
an electrically conductive lower outer layer on the insulating lower intermediate layer and forming an outermost layer of the lower surface of the carrier plate;
wherein at least one of the upper outer layer or the lower outer layer is populated with components,
wherein conductor paths in the upper inner layer are connected to conductor paths in the lower inner layer, and wherein the conductor paths in the upper inner layer are oriented in a different direction from the conductor paths in the lower inner layer, and
wherein a region between the conductor paths in the upper inner layer and the conductor paths in the lower inner layer is flooded with a voltage;
wherein the multi-layer circuit board comprises a first conductor track located on at least the upper outer layer between at least two components located on the upper outer layer and electrically connected to one another, the first conductor track configured to conduct a power supply signal; and
a second conductor track in the upper inner layer directly adjacent to the upper outer layer, the second conductor track configured to conduct a current return signal.

2. The multi-layer circuit board according to claim 1, wherein the conductor paths in the upper inner layer are substantially parallel to one another, wherein at least some of the conductor paths in the upper inner layer connect to at last some of the conductor paths in the lower inner layer, and wherein the conductor paths in the upper inner layer that are connected to the conductor paths in the lower inner layer are substantially orthogonal to the conduct paths in the lower inner layer.

3. The multi-layer circuit board according to claim 1, further comprising thermally conductive channels formed in the region between the conductor paths in the upper inner layer and the conductor paths in the lower inner layer that is flooded with the voltage, and formed parallel to at least one conductor path, the thermally conductive channels having at least one thermally conductive through connection.

4. The multi-layer circuit board according to claim 3, wherein a plurality of the conductor paths in the upper inner layer are combined to form a conductor path group.

5. The multi-layer circuit board according to claim 3, wherein a plurality of the thermally conductive through connections are at a predefined spacing to one another.

6. The multi-layer circuit board according to claim 1 further comprising additional conductor tracks in the lower outer layer.

7. The multi-layer circuit board according to claim 1, wherein the first conductor track is also located on the lower outer layer such that it is divided between the upper outer later and the lower outer layer, and wherein a connection between portions of the first conductor track located on the upper outer layer and portions of the first conductor track located on the lower outer later is obtained via at least one of an electrically conductive through connection or an insertion connector located between the upper outer layer and the lower outer layer.

8. The multi-layer circuit board according to claim 1, wherein at least one of the upper intermediate layer or the lower intermediate layer comprises a thickness of less than 100 μm.

9. An electronic assembly comprising:

a housing; and a multi-layer circuit board according to claim 1.

* * * * *